United States Patent
Hayashi et al.

(10) Patent No.: US 9,420,703 B2
(45) Date of Patent: Aug. 16, 2016

(54) WIRING BOARD AND MANUFACTURING METHOD OF THE SAME

(71) Applicant: NGK SPARK PLUG CO., LTD., Nagoya-shi, Aichi (JP)

(72) Inventors: Takahiro Hayashi, Komaki (JP); Makoto Nagai, Komaki (JP); Tatsuya Ito, Kakamigahara (JP); Seiji Mori, Konan (JP); Makoto Wakazono, Niwa-gun (JP); Tomohiro Nishida, Mizuho (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 167 days.

(21) Appl. No.: 14/237,065

(22) PCT Filed: May 27, 2013

(86) PCT No.: PCT/JP2013/003342
  § 371 (c)(1),
  (2) Date: Feb. 4, 2014

(87) PCT Pub. No.: WO2014/073128
  PCT Pub. Date: May 15, 2014

(65) Prior Publication Data
  US 2015/0216059 A1  Jul. 30, 2015

(30) Foreign Application Priority Data

Nov. 7, 2012  (JP) ................................. 2012-245250

(51) Int. Cl.
  *H05K 1/00*  (2006.01)
  *H05K 3/40*  (2006.01)
  (Continued)

(52) U.S. Cl.
  CPC .......... *H05K 3/4007* (2013.01); *H01L 21/4846* (2013.01); *H01L 23/49822* (2013.01);
  (Continued)

(58) Field of Classification Search
  CPC .......... H05K 2201/10674; H05K 2201/09845; H05K 2201/09881; H05K 3/28; H05K 3/3452; H05K 3/4661; H05K 3/4007; H05K 3/4688; H01L 2224/16225; H01L 2224/16237; H01L 2224/13147; H01L 2224/81464; H01L 2224/81455; H01L 2224/81815; H01L 2224/81411; H01L 2224/1146; H01L 2224/81444; H01L 2224/13144; H01L 2224/16227; H01L 2224/8114; H01L 2224/131; H01L 2224/1134; H01L 2224/10175; H01L 2224/73204; H01L 2924/12042; H01L 2924/15788; H01L 2924/3841; H01L 2924/15787; H01L 2924/15312; H01L 2924/1517; H01L 2924/15313; H01L 2924/381; H01L 2924/15311; H01L 2924/1579; H01L 23/49827; H01L 23/49894; H01L 23/49822; H01L 24/81
  USPC ........................................................ 174/250
  See application file for complete search history.

(56) References Cited

U.S. PATENT DOCUMENTS

2007/0212883 A1* 9/2007 Kano ....................... C08J 7/045
  438/694
2014/0054073 A1  2/2014 Lee et al.

FOREIGN PATENT DOCUMENTS

JP  2005-99301 A  4/2005
JP  2009-152317 A  7/2009
  (Continued)

OTHER PUBLICATIONS

ISA/JP, International Search Report and Written Opinion issued in corresponding international application No. PCT/ JP2013/003342, mailed Jul. 9, 2013 (translation not available).
  (Continued)

*Primary Examiner* — Timothy Thompson
*Assistant Examiner* — Guillermo Egoavil
(74) *Attorney, Agent, or Firm* — Stites & Harbison PLLC; Jeffrey A. Haeberlin; James R. Hayne

(57) ABSTRACT

To provide a wiring board in which wiring conductors are securely protected by a precise and rigid dam portion formed on an outermost layer of a laminate and that is excellent in connection reliability with a semiconductor chip. A laminate that configures this wiring board includes multiple connection terminal portions and wiring conductors as a conductor layer of the outermost layer. The wiring conductors are arranged at predetermined positions, passing through between multiple connection terminal portions for flip-chip mounting a semiconductor chip. A resin insulating layer of the outermost layer of the laminate has a dam portion and a reinforcement portion. The dam portion covers the wiring conductors. The reinforcement portion is formed, between the wiring conductor and the connection terminal portion that is adjacent to the wiring conductor, lower than a height of the dam portion. The reinforcement portion is concatenated with a side surface of the dam portion.

5 Claims, 13 Drawing Sheets

(51) Int. Cl.
*H01L 23/498* (2006.01)
*H01L 21/48* (2006.01)
*H01L 23/00* (2006.01)
*H05K 3/34* (2006.01)
*H05K 1/02* (2006.01)
*H05K 1/03* (2006.01)
*H05K 3/46* (2006.01)
*H05K 3/28* (2006.01)

(52) U.S. Cl.
CPC .... *H01L23/49827* (2013.01); *H01L 23/49894* (2013.01); *H01L 24/81* (2013.01); *H05K 1/0298* (2013.01); *H05K 1/0366* (2013.01); *H05K 3/3452* (2013.01); *H05K 3/4661* (2013.01); *H05K 3/4688* (2013.01); *H01L 2224/10175* (2013.01); *H01L 2224/1134* (2013.01); *H01L 2224/1146* (2013.01); *H01L 2224/131* (2013.01); *H01L 2224/13144* (2013.01); *H01L 2224/13147* (2013.01); *H01L 2224/16225* (2013.01); *H01L 2224/16227* (2013.01); *H01L 2224/16237* (2013.01); *H01L 2224/8114* (2013.01); *H01L 2224/81411* (2013.01); *H01L 2224/81444* (2013.01); *H01L 2224/81455* (2013.01); *H01L 2224/81464* (2013.01); *H01L 2224/81815* (2013.01); *H01L 2924/12042* (2013.01); *H01L 2924/1517* (2013.01); *H01L 2924/1579* (2013.01); *H01L 2924/15311* (2013.01); *H01L 2924/15312* (2013.01); *H01L 2924/15313* (2013.01); *H01L 2924/15787* (2013.01); *H01L 2924/15788* (2013.01); *H01L 2924/381* (2013.01); *H01L 2924/3841* (2013.01); *H05K 3/28* (2013.01); *H05K 2201/09845* (2013.01); *H05K 2201/09881* (2013.01); *H05K 2201/10674* (2013.01)

(56) References Cited

FOREIGN PATENT DOCUMENTS

| JP | 2009152317 | A | * | 7/2009 |
| JP | 2011-014644 | A |   | 1/2011 |
| JP | 2011-192692 | A |   | 9/2011 |
| JP | 2011192692 | A | * | 9/2011 |
| JP | 2011192692 | A | * | 9/2011 |
| JP | 2012-074449 | A |   | 4/2012 |
| JP | 2014-45195 | A |   | 3/2014 |
| WO | 2012-043201 | A1 |  | 4/2012 |

OTHER PUBLICATIONS

EPO, Extended European Search Report issued in corresponding European application No. 13824470.2, dated Jan. 8, 2015.
JPO, Notification of Reasons for Refusal issued in corresponding Japanese application No. 2012-245250, dispatched Apr. 22, 2014.
JPO, Notification of Reasons for Refusal issued in corresponding Japanese application No. 2014-124834, dispatched Mar. 3, 2015.

* cited by examiner

WIRING BOARD AND MANUFACTURING METHOD OF THE SAME

TECHNICAL FIELD

The present invention relates to a wiring board having multiple connection terminal portions for flip-chip mounting a semiconductor chip, and its manufacturing method.

BACKGROUND ART

In recent years, semiconductor integrated circuit elements (semiconductor chips) used as a microprocessor of a computer, etc. have developed a lot in speed and in their functions, and in accompany with this, the number of its terminals increases and there is a tendency that pitches between the terminals also become narrower. Generally, on a bottom of the semiconductor chip, a large number of connection terminals are arranged, and respective connection terminals of the semiconductor chip are connected to the multiple connection terminal portions, which are formed on a wiring board, for mounting the semiconductor in flip chip form.

For example, a wiring board for flip-chip connecting has been proposed for a peripheral type semiconductor chip such that a large number of connection terminals are arranged along an outer circumference of the chip bottom (for example, refer to PTL 1). In this wiring board, a chip mounting area in a rectangular shape corresponding to an outer shape of the semiconductor chip is set up on a substrate principal surface, and the multiple connection terminal portions are disposed in a way such as to be along an outer circumference of the chip mounting area. The multiple connection terminal portions are provided in a part of belt-like wiring conductors. The wiring conductor itself is covered by a solder-resist layer provided on the substrate principal surface as a resin insulating layer of the outermost layer, and almost whole of the wiring conductor is put in an unexposed state. On the other hand, the surface of each connection terminal portion is exposed to the outside through an opening provided in the solder-resist layer. Then, each exposed connection terminal portion and the connection terminal on the semiconductor chip side are arranged facing each other, and they are configured to be electrically connected with each other through a solder bump etc.

Further, in a wiring board 101 of this kind, as a part of increasing the number of terminals and narrowing a pitch therebetween, for example, in an opening 103 of a solder-resist layer 102, it is being tried that different wiring conductors are arranged at predetermined positions so as to pass through between multiple wiring conductors 105 having connection terminal portions 104 (refer to FIG. 15). However, in the case where wiring conductors 106 are arranged at predetermine positions between the wiring conductors 105 having the connection terminal portions 104, the connection terminal portions 104 and the wiring conductors 106 become too close in distance and mutual insulation distances are no longer secured. For this reason, there is a possibility that a short defect may occur at the time of solder connection. As its measure, it is necessary to achieve isolation of the wiring conductors 106 located in the opening 103 from adjacent connection terminal portions 104 by covering them with a part of the solder-resist layer 102 (being called a "dam portion 107" for convenience).

Here, a procedure of manufacturing the wiring board 101 shown in FIG. 15 will be explained. First, the wiring conductors 105, 106 are formed by forming a copper plating layer on a resin insulating layer 108 and etching this. Next, a photosensitive resin insulating material that becomes the solder-resist layer 102 later is applied on the resin insulating layer 108 to form a resin insulating material layer 109 that covers the wiring conductors 105, 106 (refer to FIG. 16). Next, on the resin insulating material layer 109, a photomask 110 is placed and ultraviolet rays 112 are irradiated thereon through the photomask 110 in this state. Then, the ultraviolet rays 112 contact the area that becomes directly under a light passage portion 111 of the photomask 110 fundamentally, and the area in the resin insulating material layer 109 is exposed selectively. In FIG. 16, a dashed line shows an exposure portion 113. After this, the exposed resin insulating material layer 109 is developed (refer to FIG. 17) and is also cured by heat or ultraviolet rays, and an outermost surface treatment, such as plating, is performed on the wiring conductors 105 exposed to the surface. As a result, the wiring board 101 having the precise dam portion 107 is completed (refer to FIG. 18).

CITATION LIST

Patent Literature

PTL 1: JP-A-2011-14644

SUMMARY OF THE INVENTION

Technical Problem

However, in the above-described related-art manufacturing method, in the case where the width of an exposure portion 113 is set narrow in order to form a precise dam portion 107 of a narrow width and exposure is performed on a conventional normal condition, ultraviolet rays 112 may not reach deep portions of the resin insulating material layer 109 sufficiently. Then, in this case, an exposure defective region 115 (an unexposed or insufficiently exposed region) tends to occur readily at the bottom of the exposure portion 113 as shown in FIG. 16. Therefore, if development is performed on the conventional normal condition, the exposure defective region 115 on the bottom will be exposed, and that portion will become an undercut 114 (refer to FIG. 17 etc.). If such an undercut 114 exists, strength of the dam portion 107 becomes lower, which will cause an exfoliation and so on. Besides this, if wiring conductors 106 are exposed in the undercut 114, it is likely to happen that an outermost surface treatment may be a cause of a short defect between the wiring conductors 105 and 106. Further, as shown in FIG. 19, such a short defect is also likely to be caused, if a solder bump 122, being formed on the connection terminal 121 at a side of the semiconductor chip 120, slides into the undercut 114. These problems caused by an insufficiency of a hardening depth at the time of the solder-resist exposure as described above becomes more remarkable as a solder-resist layer 102 becomes thicker.

In order to avoid the situation where the hardening depth at the time of solder-resist exposure is insufficient, for example, a counter measure may be conceivable such as performing exposure with an amount of light exposure higher than the conventional normal condition. Then, by employing such a measure, the exposure defective region 115 may not occur so that the undercut 114 will not be formed at the pattern bottom (refer to FIG. 20 to FIG. 23). However, in this case, since the ultraviolet rays 112 leak from a light passage portion 111 of a photomask 110 occurs, "halation" may eventually occur, and exposure to the light may be readily made not only at a portion immediately beneath the light passage portion 111 but also at its surrounding area (see an area shown by 113A in FIG. 20). Therefore, dam portions 107A may be formed in a way such as having a width wider than that of originally intended are formed, and in connection with this, an interval between the dam portions 107A, which is located on the both sides of a terminal portion 104 sandwiched in-between, becomes narrow (refer to FIG. 21 and FIG. 22). Therefore, if displacement occurs, even in a small amount, as mounting a semiconductor chip 120 on the wiring board 101, a connection terminal 121 on the side of a semiconductor chip 120 and a solder bump 122 will contact the dam portion 107A (refer to FIG. 23). Therefore, poor connection occurs readily in such a case.

Moreover, as another counter measure, performing development with setting a developing time shorter than that of being set for the conventional normal condition may be also conceivable. With this measure, even a case where the exposure defective region 115 remains, said defective portion may not be developed, and therefore, the undercut 114 will not be formed on the pattern bottom (refer to FIG. 24 to FIG. 26). However, in this case, the resin insulating material layer 109 will partially adhere to a portion that should be originally developed (for example, upper surfaces of the connection terminal portions 104, etc.) and will be hardened as it is. As a result, a residual solder-resist 123 arises, and when the outermost surface treatment, such as plating, is performed, which turns out a defect such that a non-plated portion is likely to be made (refer to FIG. 26). Therefore, poor connection is also readily to happen.

Therefore, even if these two measures for preventing the undercut 114 were taken, it was difficult to form the precise and rigid dam portion 107 stably on the wiring conductor 106.

The present invention is made in view of the above-described problem, and its object is to provide the wiring board whose wiring conductors are certainly protected by the precise and rigid dam portion formed on the outermost layer of a laminate so that excellent connection reliability is achieved with the semiconductor chip. Moreover, another object thereof is to provide a manufacturing method of the wiring board so that the above-described wiring board, having excellent connection reliability with the semiconductor chip, can be securely manufactured.

Solution to Problem

According to means (means 1) for solving the above-described problems, there is provided a wiring board comprising a laminate, in which one or more resin insulating layers and one or more conductor layers are stacked, wherein the conductor layer of an outermost layer of the laminate comprises: a plurality of connection terminal portions, which are disposed in a mounting area of a semiconductor chip and surfaces of which are exposed for flip-chip mounting the semiconductor chip; and a wiring conductor that is arranged at a predetermined position between the plurality of connection terminal portions, and wherein the resin insulating layer of the outermost layer of the laminate comprises: a dam portion for covering the wiring conductor; and a reinforcement portion, which is formed between the wiring conductor and the connection terminal portion adjacent to the wiring conductor and to be lower than a height of the dam portion, and which is concatenated with a side surface of the dam portion.

Therefore, according to the invention described in the first means, when the precise dam portion is formed as a part of a resin insulating layer of the outermost layer of the laminate, a reinforcement portion is integrated to its side surfaces, resulting in a reinforcement at a bottom of the dam portion, a place where an undercut was likely to be created in the conventional ways. Therefore, the precise and rigid dam portion can be obtained, and the wiring conductors, which are arranged at predetermined positions passing through between multiple connection terminal portions, are securely protected by the dam portion, and as a result, exfoliation of the dam portion and exposure of the wiring conductor from the dam portion are avoided. Moreover, since the reinforcement portion is formed lower than a height of the dam portion, it is avoided that the reinforcement portion may contact the connection terminal on the semiconductor chip side. From the above, it becomes possible to certainly connect the connection terminal on the semiconductor chip side and the connection terminal portion through solder etc., and thus the wiring board becomes excellent in the connection reliability with the semiconductor chip.

The wiring board of the first means is a so-called organic wiring board that has a laminate in which one or more layers of the resin insulating layers and one or more layers of conductor layers are stacked, respectively. An advantage of the organic wiring board resides at easiness of attaining high-density wiring as compared with, for example, a ceramic wiring board etc.

The resin insulating layer may be formed using a buildup material whose main component is a thermosetting resin, for example. As a concrete example of the formation material of the resin insulating layer, there are some thermosetting resins enumerated, such as an epoxy resin, a phenol resin, a urethane resin, a silicone resin, and a polyimide resin. In addition, a composite material of these resins, a glass fiber (glass woven fabric and glass non-woven fabric), and an organic fiber such as a polyamide fiber, or a resin-resin composite material such that a thermosetting resin such as an epoxy resin is impregnated into a three-dimensional network fluorine-system resin base material of a porous continuum PTFE etc. may be used as well.

Although the conductor layer can be formed using various kinds of conductive metals, such as copper, silver, gold, platinum, nickel, titanium, aluminum, and chromium, it is preferable to compose a main component with copper as the conductor layer in the organic wiring board. As the methods of forming the conductor layer, publicly known methods can be used, such as a subtractive method, a semiadditive method, and a full additive method, and so on. More specifically, for example, etching of copper foil method, electroless copper plating, or electrolytic copper plating may be applied. Further, it is also possible to form the conductor layer by performing etching after forming a thin film with a method, such as sputtering and CVD, or to form the conductor layer by printing of conductive paste etc.

Any semiconductor chip will do as long as it is capable of being flip-chip mounted on the wiring board, and to be specific, it may be either of a peripheral type where a large number of connection terminals are arranged along an outer circumference of the chip bottom, or of an area type where a large number of connection terminals are arranged in the whole area of the chip bottom. Further, as the semiconductor chip, they might be an IC chip used as a microprocessor of a computer, or IC chips, such as DRAM (Dynamic Random Access Memory) and SRAM (Static Random Access Memory).

This wiring board has the multiple connection terminal portions as a part of the conductor layer of the outermost layer in the laminate. The multiple connection terminal portions are disposed in the mounting area of the semiconductor chip in order to apply flip-chip mounting to the semiconductor chip. The multiple connection terminal portions are formed, for example, as a part of the wiring conductors, and the part is exposed from the resin insulating layer of the outermost layer (this is so called "exposed wiring conductors"). The connection terminal portions may be located at the ends of the exposed wiring conductors, or may be each located in the middle thereof. Moreover, although the connection terminal portion may be formed into a width equal to that of the exposed wiring conductor, the width of the connection terminal portion may also be formed into a width wider than that of the exposed wiring conductor. When the wider connection terminal portion is adopted, the connection terminal portion may be formed to be, for example, a square shape, a rectangular shape, an elliptical shape, or a circular shape in plane view. A plane view shape of the connection terminal portion can be properly altered according to the design planning of the wiring board, a terminal shape of the semiconductor chip, and so on. Further, when it is formed to be a connection terminal portion in a rectangular shape, the multiple connection terminal portions may be disposed so as to be parallel to each other. Moreover, a pitch between adjacent of the multiple connection terminal portions may be set to 100 μm or less, and preferably 80 μm or less in order to attain a high density arrangement.

The resin insulating layer of the outermost layer in the laminate is formed of a resin insulating material having photosensitivity, for example, a solder-resist material. One or multiple openings are formed in the mounting area of the semiconductor chip in the resin insulating layer of the outermost layer. A shape of the opening is not necessarily limited as long as it can expose surfaces of multiple connection terminals, however, it might be rather better to form the opening into a rectangular belt shape (a slit shape).

This wiring board has wiring conductors that are arranged at predetermined positions passing through between the multiple connection terminal portions as the conductor layer of the outermost layer in the laminate. Since this wiring conductor is principally not exposed to the outside unlike the above-described exposed wiring conductor, it will be so called an "unexposed wiring conductor" for convenience. It is preferable for the unexposed wiring conductors to be arranged in parallel to the multiple connection terminal portions, and to be separated with constant intervals in order to obtain high-density mounting.

The dam portion that configures a part of the resin insulating layer of the outermost layer covers the unexposed wiring conductors totally. With reference to a level of the bottom of the resin insulating layer of the outermost layer, the height of the dam portion is set higher than a height of the unexposed wiring conductor, and lower than or equal to a height of the resin insulating layer of the outermost layer except the dam portion and the reinforcement portion. However, moreover to say, it is more preferable set the height of the dam portion to be equivalent to the height of the resin insulating layer of the outermost layer except the dam portion and the reinforcement portion. A width (an upper portion width) of the dam portion is set slightly wider than a width (an upper portion width) of the unexposed wiring conductor, and more specifically, set to 1.1 or more times and 2.5 or less times of the width (the upper portion width) of the unexposed wiring conductor. If this value is less than 1.1 times, the width of the dam portion will become too narrow and there will be a possibility such that the side surface of the unexposed wiring conductor may no longer be covered sufficiently. On the other hand, if this value exceeds 2.5 times, there will be a possibility such that the connection terminal on the semiconductor chip side and the solder bump may become readily contact the dam portion.

The reinforcement portion, which configures a part of the resin insulating layer of the outermost layer, is formed between the unexposed wiring conductor and its adjacent connection terminal portion, and formed on a surface of the resin insulating layer located directly under the resin insulating layer of the outermost layer to be integrated with the side surface of the dam portion. It is preferable for the reinforcement portion to fill between the unexposed wiring conductor and the connection terminal portion that is adjacent to the unexposed wiring conductor. With this configuration, the reinforcement portion becomes long to some extent along a direction that intersects perpendicularly with a longitudinal direction of the unexposed wiring conductor and the dam portion, and a contact area of the reinforcement portion and the above-described resin insulating layer that supports the reinforcement portion also becomes large. Therefore, the dam portion is reinforced securely and the dam portion is stabilized.

A height of the reinforcement portion with reference to a bottom of the insulating layer of the outermost layer should be formed lower than the height of the dam portion. More specifically, it is preferable that the height of the reinforcement portion is less than or equal to a height of the multiple connection terminal portions, and it is also preferable that at least surfaces of the multiple connection terminal portions are exposed from the reinforcement portion. According to this configuration, even when the reinforcement portion completely fills between the unexposed wiring conductors and connection terminal portions, a surface of the connection terminal portion is not in a position lower than the upper surface of the reinforcement portion, which turns out lowering the problem of connecting the connection terminal on the semiconductor chip side to the connection terminal portion.

Furthermore, it is more preferable for the height of the reinforcement portion to be lower than the height of the multiple connection terminal portions, and it is more preferable for the entire surfaces and the upper portions of the side surfaces of the multiple connection terminal portions to be exposed from the reinforcement portion. With this configuration, even when the reinforcement portion has completely filled between the unexposed wiring conductors and the connection terminal portions, it becomes in a state where three surfaces in the connection terminal portion are exposed, and a contact area with a conductive metallic material, such as solder, also becomes large. Therefore, the connection terminal portion and the connection terminal on the semiconductor chip side are connected more securely.

Although both the dam portion and the reinforcement portion are formed of the resin insulating material having photosensitivity, it is preferable for these portions to be formed of a common solder-resist material, for example, and to be formed integrally. The structure thus integrally formed can increase strength of an integrated portion of the dam portion and the reinforcement portion, and can reinforce the dam portion more securely. Moreover, according to this structure, unlike a structure in which the dam portion and the reinforcement portion are formed by using different solder-resist materials, respectively, it is readily to realize reducing a manufacturing cost and simplifying a manufacturing process.

Outermost surface treatment, such as plating and sputtering, may be performed on the multiple connection terminal portions exposed on the surface of the laminate. For example, in the case where a conductive metal that configures the multiple connection terminal portions is copper or a copper alloy, a layer formed of a metal other than copper or a copper alloy (a nickel layer, a palladium layer, a gold layer, a tin layer, etc.) may be formed as the outermost surface treatment.

According to other means (means 2) for solving the above-described problems, there is provided a manufacturing method of the wiring board according to the means 1, comprising: a conductor layer formation step of forming the plurality of connection terminal portions and the wiring conductor in a mounting area of the semiconductor chip; and a resin insulating layer formation step comprising: forming the resin insulating layer of an outermost layer by arranging a resin insulating material having photosensitivity that becomes the resin insulating layer of the outermost layer on the plurality of connection terminal portions and the wiring conductor in a state where the resin insulating material covers the plurality of connection terminal portions and the wiring conductor and performing partial exposure and development on the resin insulating material; and integrally forming the dam portion and the reinforcement portion.

Therefore, according to the invention described in the means 2, in a resin insulating layer formation process, the resin insulating layer of the outermost layer is formed by performing partial exposure and development on the resin insulating material having photosensitivity that is arranged on the multiple connection terminal portions and the wiring conductors. At this time, together with this, the dam portion that covers the wiring conductor is formed, and the reinforcement portion integrated with a side surface of the dam portion is integrally formed. Therefore, since even when the precise dam portion is formed, the reinforcement portion is integrated with its side surface so that the bottom of the dam portion, in which an undercut is originally likely to be created, is reinforced. Therefore, the precise and rigid dam portion can be obtained more readily and securely. Moreover, according to the present invention, since it becomes unnecessary to take a measure for avoiding the undercut, the problematic situations, such as generation of halation resulting from a high amount of exposure and generation of residual resin resulting from short-time development, can be avoided, and consequently a risk of occurrence of poor connection will be reduced. Therefore, the above-described wiring board excellent in the connection reliability with the semiconductor chip can be manufactured comparatively readily and securely.

DESCRIPTION OF EMBODIMENTS

Hereinafter, one embodiment in which the present invention is embodied into an organic wiring board as a wiring board will be described in detail based on FIG. 1 to FIG. 12.

Figure 1:
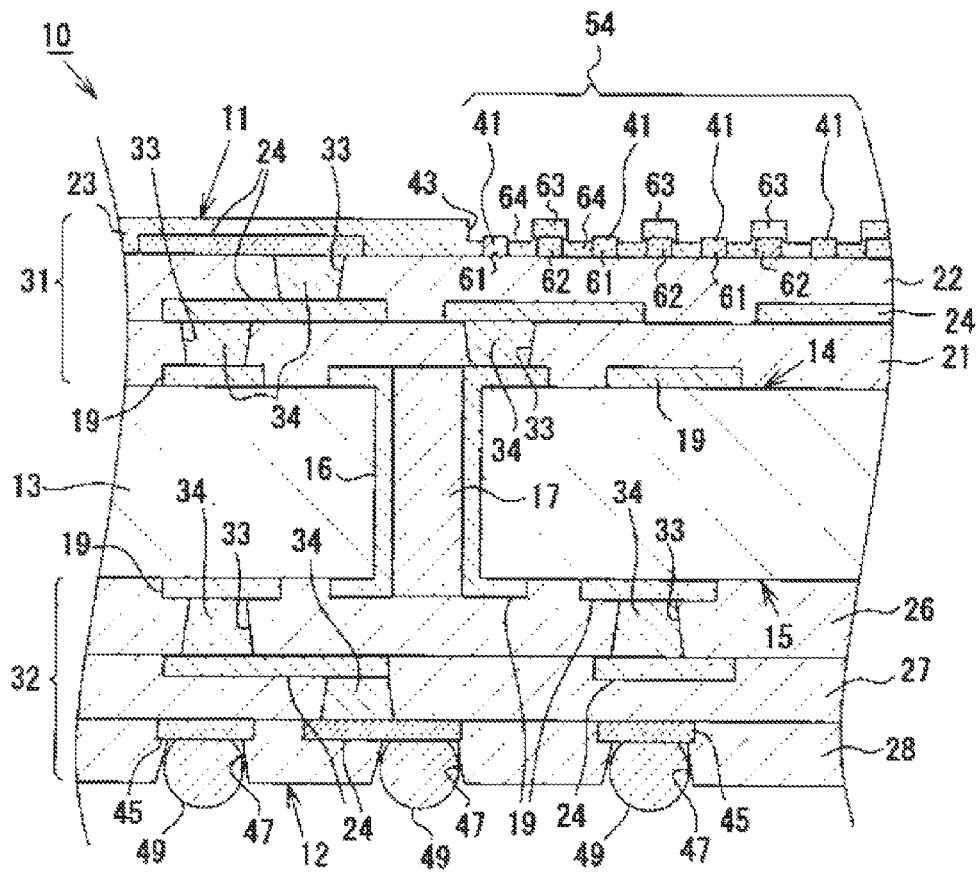
FIG. 1 A partial sectional view showing an organic wiring board that is implemented with the present invention.

An organic wiring board 10 of this embodiment is a wiring board having a peripheral structure, and has a substrate principal surface 11 serving as a semiconductor chip mounting surface and a substrate rear surface 12 located in its opposite side, as shown in FIG. 1. This organic wiring board 10 has a core substrate 13 in a rectangular plate shape, a first buildup layer 31 formed on a core principal surface 14 (in FIG. 1, an upper surface) of the core substrate 13, and a second buildup layer 32 formed on a core rear surface 15 (in FIG. 1, an undersurface) of the core substrate 13.

The core substrate 13 of this embodiment is formed of a resin insulating material (a glass epoxy material) obtained, for example, by impregnating an epoxy resin into glass cloth serving as a reinforcement material. In the core substrate 13, multiple through hole conductors 16 are formed so as to penetrate the core principal surface 14 and the core rear surface 15. The inside of the through hole conductor 16 is filled up with a blocking body 17, such as an epoxy resin, for example. Moreover, on the core principal surface 14 and the core rear surface 15 of the core substrate 13, a conductor layer 19 formed of copper is pattern-formed. These conductor layers 19 are electrically connected to the through hole conductor 16.

Figure 2:
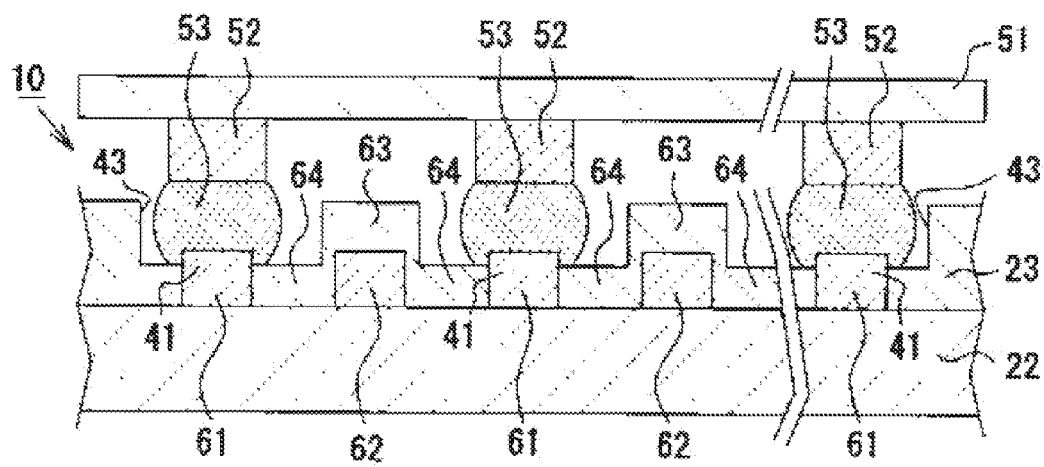
FIG. 2 A main part enlarged sectional view showing the above-described wiring board on which a semiconductor chip is flip-chip mounted.
Figure 3:
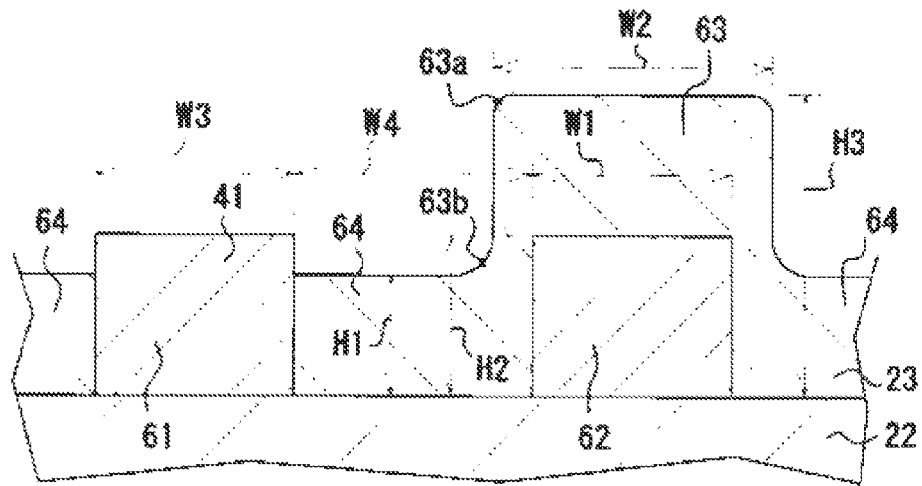
FIG. 3 A main part enlarged sectional view showing a dam portion and a reinforcement portion in the above-described wiring board.
Figure 4:
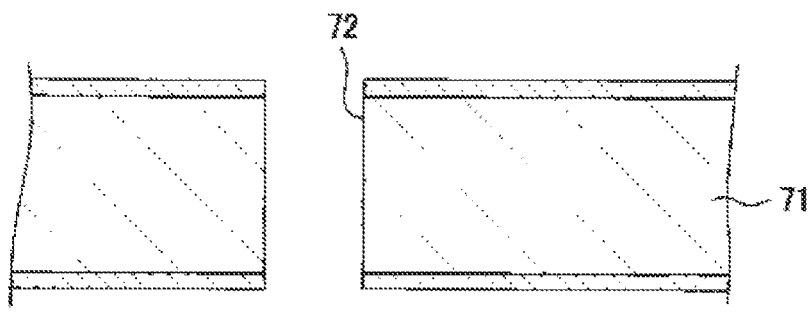
FIG. 4 A partial sectional view for illustrating a manufacturing method of the above-described wiring board.

The first buildup layer 31 formed on the core principal surface 14 of the core substrate 13 is a laminate that has a structure in which multiple resin insulating layers 21, 22, and 23 formed of a thermosetting resin (an epoxy resin) and multiple conductor layers 24 formed of copper are stacked. The resin insulating layers 21, 22 are formed of a resin insulating material (for example, an epoxy resin) having thermosetting property. In the first buildup layer 31, the conductor layer 24 of the outermost layer contains multiple connection terminal portions 41 arranged along an outer circumference of a chip mounting area 54 in order to flip-chip mount a semiconductor chip 51. In this embodiment, the resin insulating layer 23 of the outermost layer in the first buildup layer 31 is a solder-resist layer 23 formed of a resin insulating material having photosensitivity. In the solder-resist layer 23, multiple slit openings 43 are formed in positions corresponding to four sides of the chip mounting area 54. Then, as shown in FIG. 1 to FIG. 3, in the opening 43 of the solder-resist layer 23, the multiple connection terminal portions 41 are formed at equal intervals. In this embodiment, these connection terminal portions 41 form rectangular shapes in plane view, and are formed in a top end portion or in the middle of a wiring conductor 61 exposed from the opening 43 of the solder-resist layer 23 (namely, the exposed wiring conductor 61). Here, a width of the connection terminal portion 41 is made equal to a width of the exposed wiring conductor 61.

In this embodiment, the multiple connection terminal portions 41 are provided on an upper surface of the resin insulating layer 22. Moreover, via holes 33 and filled via conductors 34 are formed in the resin insulating layers 21, 22, respectively. Each via conductor 34 is electrically connected to respective conductor layers 19, 24 and the connection terminal portion 41.

As the semiconductor chip 51 mounted on the wiring board 10 of this embodiment, for example, one that has a connection terminal 52 of a Cu pillar structure is used. Further, the semiconductor chip 51 that has the connection terminal 52 of a Au plating hump structure or Au stud structure other than the Cu pillar structure may be flip-chip mounted.

The second buildup layer 32 formed on the core rear surface 15 of the core substrate 13 has the almost same structure as that of the first buildup layer 31 described above. That is, the second buildup layer 32 has a structure in which resin insulating layers 26, 27, and 28 and the conductor layer 24 are stacked. In the second buildup layer 32, multiple external connection terminals 45 for connecting to a mother board. (illustration omitted) are formed as the conductor layer 24 of an outermost layer. Moreover, the via hole 33 and the via conductor 34 are formed also in the resin insulating layers 26, 27. Each via conductor 34 is electrically connected to the conductor layers 19, 24 and the external connection terminal 45. Furthermore, the resin insulating layer 28 of the outermost layer in the second buildup layer 32 is configured of the solder-resist 28. Opening 47 for exposing the external connection terminals 45 are provided in designated places of the solder-resist 28. Moreover, in the external connection terminal 45, the undersurface exposed in the opening 47 is covered by an unillustrated plating layer (for example, a nickel-gold plating layer). Multiple solder bumps 49 capable of electrically connecting to an unillustrated mother board are arranged at predetermined positions on the undersurface of the external connection terminal 45. Then, the organic wiring board 10 is mounted on an unillustrated mother board with the solder bumps 49.

Next, several structures provided in the chip mounting area 54 on the first buildup layer 31 on the side of the substrate principal surface 11 will be explained in detail using FIG. 2 and FIG. 3.

On the resin insulating layer 22 located immediately under the solder-resist layer 23, another multiple wiring conductors 62 that have not been exposed to the outside (namely, the unexposed wiring conductors 62) are arranged at predetermined positions besides the exposed wiring conductors. The unexposed wiring conductors 62 are formed in parallel to the exposed wiring conductors 61 having the connection terminal portions 41 in a way such that each of the unexposed wiring conductor 62 pass through between them. A width W3 in an upper portion of the exposed wiring conductor 61 (namely, a width in an upper portion of the connection terminal portion 41) is equal to a width W1 in an upper portion of the unexposed wiring conductor 62, for example, the width W3 is set to about 10 µm to 30 µm (in this embodiment, 20 µm). An interval W4 between the exposed wiring conductor 61 and the unexposed wiring conductor 62 is also set, for example, to about 10 µm to 30 µm this embodiment, 20 µm). Moreover, a height H2 of the exposed wiring conductor 61 and the unexposed wiring conductor 62 with reference to a level of the surface of the resin insulating layer 22 (namely, a bottom of the solder-resist layer 23) is set, for example, to about 10 µm to 20 µm (in this embodiment, 15 µm).

The solder-resist layer 23 has a dam portion 63 and a reinforcement portion 64 in the opening 43. The dam portion 63 is formed of a resin insulating material having photosensitivity, and covers globally the unexposed wiring conductor 62. A height H3 of the dam portion 63 with reference to the level of the surface of the resin insulating layer 22 is set equal to a height of the solder-resist layer 23 outside the opening 43, and is set to, for example, about 20 µm to 40 µm (in this embodiment, 30 µm). Further, when the height H2 of the unexposed wiring conductor 62 is used as an object being compared, the height H3 of the dam portion 63 is set to 1.1 to 2.5 times the height H2, and is set to about two times in this embodiment. On the other hand, a width W2 in an upper portion of the dam portion 63 is set to about 1.1 to 2.5 times the width W1 in the upper portion of the unexposed wiring conductor 62 (in this embodiment, about 30 µm that is about 1.5 times).

On the surface of the resin insulating layer 22, the reinforcement portion 64 is formed between the unexposed wiring conductor 62 and the connection terminal portion 41 that is adjacent to the unexposed wiring conductor 62, filling the portion therebetween completely. The reinforcement portion 64 is formed of a resin insulating material having photosensitivity like the dam portion 63, and is integrated with both side surfaces of the dam portion 63 into one piece. A height H1 of the reinforcement portion 64 with reference to the level of the surface of the resin insulating layer 22 is lower than the height H2 of the exposed wiring conductor 61 (the height H2 of the connection terminal portion 41), and is set to about 3 µm to 12 µm in this embodiment. Therefore, the entire surfaces and the upper portions of the side surfaces of the multiple connection terminal portions 41 are in a state of being exposed from the reinforcement portion 64. Further, lower portions of the side surfaces of the multiple connection terminal portions 41 are in a state of being in contact with the reinforcement portion 64. Moreover, when comparing a curvature of a corner portion of the superior margin region 63a of the dam portion 63 and a curvature of a corner portion of the concatenation region 63b between the dam portion 63 and the reinforcement portion 64, as shown in FIG. 3, the former is larger than the latter.

Next, a manufacturing method of the organic wiring board 10 of this embodiment will be explained based on FIG. 4 to FIG. 12.

First, a copper-clad stack plate such that copper foil is stuck on both surfaces of a base material formed of glass epoxy is prepared. Then, hole boring is performed using a drill machine so that a through hole 72 (refer to FIG. 4) is formed at a specified position in advance in a way to penetrate the front and back surfaces of a copper-clad stack 71. Then, the through hole conductor 16 is formed in the through hole 72 by performing electroless copper plating and electrolytic copper plating on an internal surface of the through hole 72 of the copper-clad stack 71.

Figure 5:
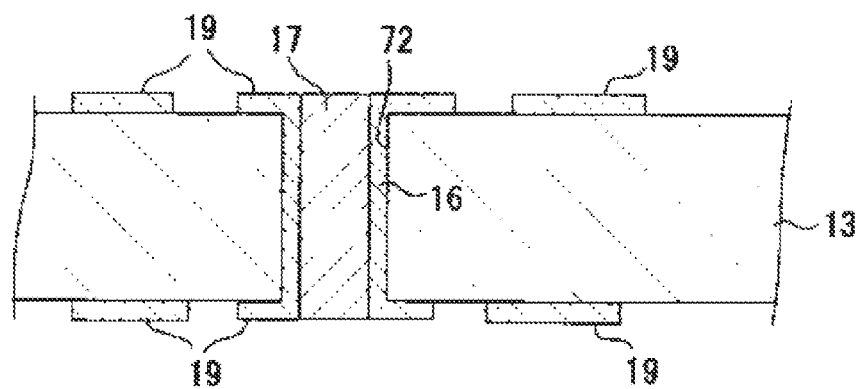
FIG. 5 A partial sectional view for illustrating the manufacturing method of the above-described wiring board.
Figure 6:
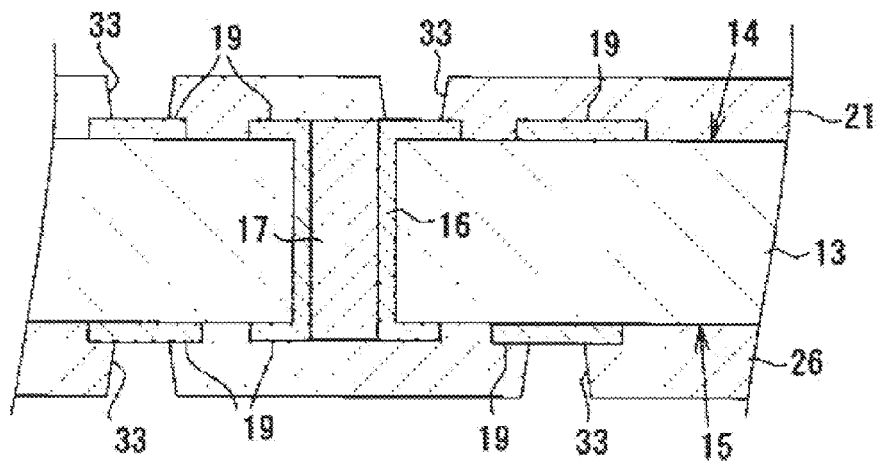
FIG. 6 A partial sectional view for illustrating the manufacturing method of the above-described wiring board.
Figure 7:
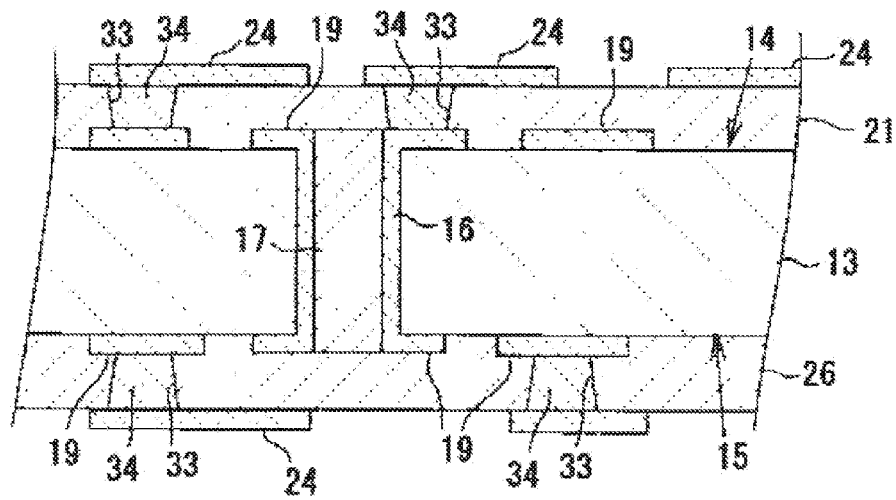
FIG. 7 A partial sectional view for illustrating the manufacturing method of the above-described wiring board.
Figure 8:
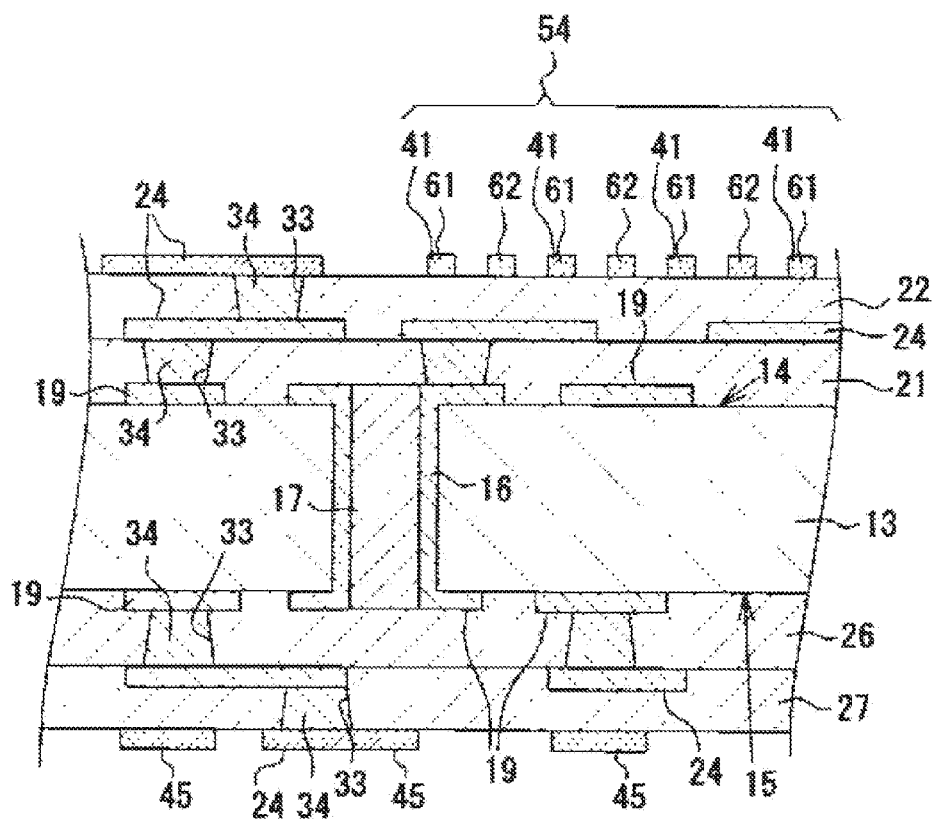
FIG. 8 A main part enlarged sectional view for illustrating the manufacturing method of the above-described wiring board.

Then, the blocking body 17 is formed by embedding a hollow portion of the through hole conductor 16 with an insulating resin material. (an epoxy resin) and hardening the insulating resin material. Furthermore, copper foil of the copper-clad stack 71 and a copper plating layer formed on the copper foil are patterned, for example, by a subtractive method. As a result, as shown in FIG. 5, the core substrate 13, in which the conductor layer 19 and the through hole conductor 16 are formed, is obtained.

Then, by performing a buildup process, the first buildup layer 31 is formed on the core principal surface 14 of the core substrate 13, and the second buildup layer 32 is formed also on the core rear surface 15 of the core substrate 13.

In detail, on the core principal surface 14 and the core rear surface 15 of the core substrate 13, the sheet-like resin insulating layers 21, 26 formed of an epoxy resin are arranged, and the resin insulating layers 21, 26 are stuck thereto. Then, the via holes 33 are formed in predetermined positions of the resin insulating layers 21, 26 by performing laser beam milling, for example, using an excimer laser, a UV laser, a $CO_2$ laser, or the like (refer to FIG. 6). Subsequently, a desmear process of removing smear in each via hole 33 using an etching solution, such as potassium permanganate solution, is performed. Further, as the desmear process, a processing of plasma ashing, for example, by $O_2$ plasma may be performed other than the processing using the etching solution.

A via conductor 34 is formed in each via hole 33 by performing the electroless copper plating and the electrolytic copper plating in accordance with conventionally and publicly known methods. Furthermore, the conductor layers 24 are pattern-formed on the resin insulating layers 21, 26 by etching with a conventionally and publicly known method (for example, a semiadditive method) (refer to FIG. 7).

Other resin insulating layers 22, 27 and the conductor layers 24 are also formed with the same method as that of the resin insulating layers 21, 26 and the conductor layers 24 described above, being stacked on the resin insulating layers 21, 26. Further, here, as the conductor layer 24 on the resin insulating layer 22, the exposed wiring conductors 61 having the multiple connection terminal portions 41 and the unexposed wiring conductors 62 are formed, respectively (refer to FIG. 8: a conductor layer formation process). Moreover, multiple external connection terminals 45 are formed as the conductor layer 24 on the resin insulating layer 27.

Figure 9:
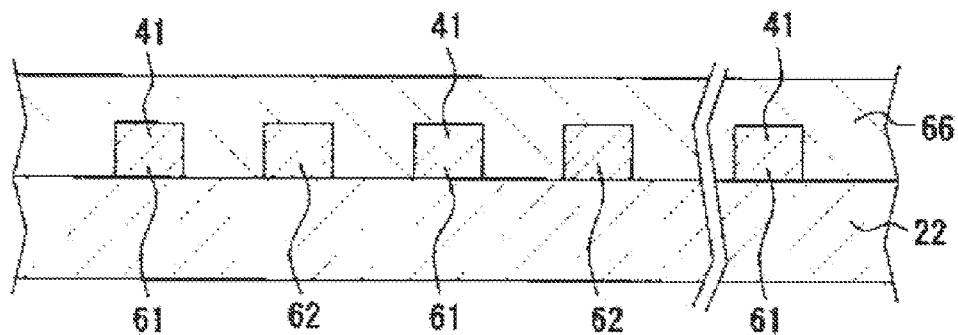
FIG. 9 A main part enlarged sectional view for illustrating the manufacturing method of the above-described wiring board.

Next, the photosensitive resin insulating material that becomes the solder-resist layer 23 later is applied on the resin insulating layer 22 and is hardened to form a resin insulating material layer 66 that covers globally the exposed wiring conductors 61 and the unexposed wiring conductors 62 (refer to FIG. 9). Here, as the photosensitive resin insulating material, for example, a solder-resist material whose main component is a photosensitive epoxy resin is selected. In this case, the solder-resist material may be a liquid capable of being applied to the layer, and may be a film-like object capable of sticking to the layer. When using the film-like solder-resist material, it is preferable to perform exposure and development after pressing the solder-resist material, having been already stuck, in its thickness direction in order to secure surface flatness.

Figure 10:
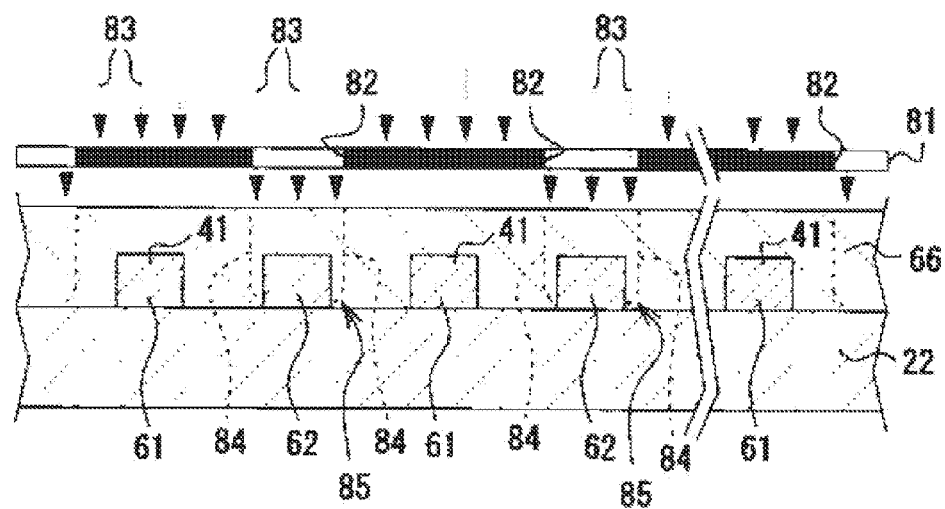
FIG. 10 A main part enlarged sectional view for illustrating the manufacturing method of the above-described wiring board.

Next, a photomask 81, having a light passage portion 82 being formed in a designated place of the glass substrate, is placed on the resin insulating material layer 66. By irradiating the resin insulating material layer 66 with ultraviolet rays 83 through the photomask 81 on a conventional normal condition in this state, partial exposure to the resin insulating material layer 66 is performed (refer to FIG. 10). By this exposure, the ultraviolet rays 83 contact an area directly under the light passage portion 82 of the photomask 81, and the area in the resin insulating material layer 66 is exposed to the rays selectively. In FIG. 10, a dashed line shows an exposure portion 84 that will become the dam portion 63 etc. later. When the exposure is performed on the above-described condition, there is a possibility that the ultraviolet rays 83 do not fully reach a deep portion of the resin insulating material layer 66, and exposure defective regions 85 occurs at a pattern bottom of the exposure portion 84.

Figure 11:
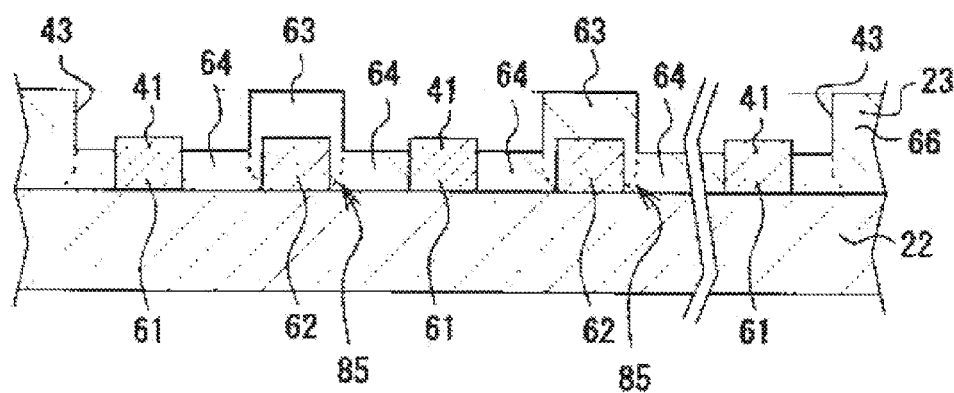
FIG. 11 A main part enlarged sectional view for illustrating the manufacturing method of the above-described wiring board.
Figure 12:
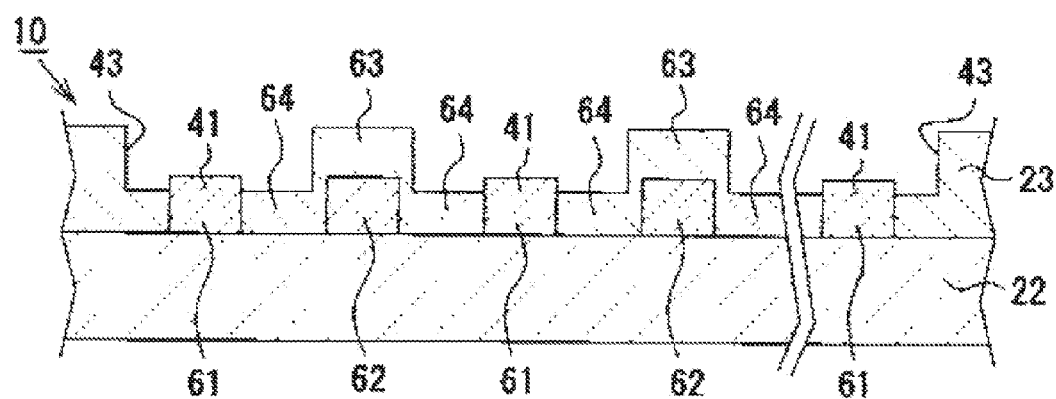
FIG. 12 A main part enlarged sectional view for illustrating the manufacturing method of the above-described wiring board.

After that, a condition whereby a portion of a thickness of about 3 μm to 12 μm is left in the unexposed portion is set, and the resin insulating material layer 66 is developed using an exclusive developing solution (refer to FIG. 11). This development forms the solder-resist layer 23 that is a resin insulating layer of the outermost layer, and forms the dam portion 63 and the reinforcement portion 64 that configure a part of that solder-resist layer 23 into one piece (a resin insulating layer formation process). Then, furthermore, after curing the solder-resist layer 23, the dam portion 63, and the reinforcement portion 64 by heat or ultraviolet rays (refer to FIG. 12), an outermost surface treatment, such as nickel-gold plating, is performed on the exposed wiring conductors 61. By undergoing the above processes, the organic wiring board 10 that has the precise dam portion 63 and the reinforcement portion 64 integrated thereto is completed.

Therefore, according to this embodiment, the following effects can be obtained.

(1) The organic wiring board 10 of this embodiment is configured to have the dam portion 63 and the reinforcement portion 64 as described above. Therefore, even when the precise dam portion 63 is formed as a part of the solder-resist layer 23, the reinforcement portion 64 is integrated with its side surface. For this reason, a bottom of the dam portion 63, in which an undercut is originally likely to be created, can be reinforced. Therefore, the precise and rigid dam portion 63 can be obtained, and the unexposed wiring conductors 62, being arranged at predetermined positions passing through between the multiple connection terminal portions 41, are securely protected by the dam portions 63. As a result, the problematic situations, such as exfoliation of the dam portion 63 and exposure of the unexposed wiring conductor 62 from the dam portion 63, can be avoided. Moreover, since the reinforcement portion 64 is formed lower than the height H3 of the dam portion 63, it is avoided that the reinforcement portion 64 may contact the connection terminal 52 on the side of the semiconductor chip 51. From the above, it becomes possible to secure connect the connection terminal 52 on the side of the semiconductor chip 51 and the connection terminal portion 41 through a solder bump 53, and thereby the organic wiring board 10 excellent in connection reliability with the semiconductor chip 51 can be obtained.

(2) In the organic wiring board 10 of this embodiment, the reinforcement portion 64 completely fills between the unexposed wiring conductors 62 and its adjacent the connection terminal portions 41. According to this configuration, the reinforcement portion 64 becomes long to some extent along a direction (namely, a horizontal direction of FIG. 1 to FIG. 3) that intersects perpendicularly with a longitudinal direction of the unexposed wiring conductor 62 and the dam portion 63. Therefore, a contact area of the reinforcement portion 64 and the resin insulating layer 22 that supports the reinforcement portion 64 also becomes large. Accordingly, the configuration has an advantage that the dam portion 63 is reinforced securely and the dam portion 63 is stabilized. Accordingly, the problematic situations, such as exfoliation of the dam portion 63 and exposure of the unexposed wiring conductor 62 from the dam portion 63, can be avoided more securely, and consequently the connection reliability with the semiconductor chip 51 can be improved further.

(3) In the organic wiring board 10 of this embodiment, the height H1 of the reinforcement portion 64 is made lower than the height H2 of the multiple connection terminal portions 41. As a result, surfaces and upper portions of the side surfaces of the multiple connection terminal portions 41 are exposed from the reinforcement portions 64. With this configuration, even if the reinforcement portion 64 has completely filled between the unexposed wiring conductor 62 and the connection terminal portion 41, it will be in a state where three surfaces in the connection terminal portion 41 will be exposed. Therefore, a contact area of the multiple connection terminal portions 41 and the conductive metallic material, such as solder, becomes large. Therefore, the connection terminal portion 41 and the connection terminal 52 on the side of the semiconductor chip 51 are connected more securely, and consequently the connection reliability with the semiconductor chip 51 can be improved much more.

(4) In the organic wiring board 10 of this embodiment, the dam portion 63 and the reinforcement portion 64 are formed of a common solder-resist material, and are formed in one piece. Then, with the structure integrally formed in this way, it is possible to raise strength of the concatenation portion of the dam portion 63 and the reinforcement portion 64 and therefore to reinforce the dam portion 63 more securely. Moreover, according to this structure, unlike a structure in which the dam portion 63 and the reinforcement portion 64 are formed using different solder-resist materials, respectively, it becomes easy to attain reduction of a manufacturing cost and simplification of a manufacturing process.

(5) In this embodiment, a desired organic wiring board 10 is manufactured through the conductor layer formation process and the resin insulating layer formation process as described above. That is, in the resin insulating layer formation process, when the solder-resist layer 23 is formed, the dam portion 63, covering the unexposed wiring conductor 62, and the reinforcement portion 64, contacting to its side surface, are simultaneously formed integrally. Therefore, since even when the precise dam portion 63 is formed, the reinforcement portion 64 is concatenated with its side surface, the bottom of the dam portion 63 where an undercut originally tends to develop is reinforced. Therefore, the precise and rigid dam portion 63 can be obtained comparatively readily and securely. Moreover, according to the manufacturing method of this embodiment, it becomes unnecessary to take a measure for avoiding the undercut Therefore, the problematic situations, such as generation of halation resulting from a high amount of exposure and generation of residual resin resulting from short time development can be avoided, and a risk of occurrence of poor connection is reduced as a result. Therefore, it is possible to manufacture the organic wiring board 10 excellent in the connection reliability with the semiconductor chip 51 comparatively readily and securely.

Further, the embodiment of the present invention may be modified as follows.

Figure 13:
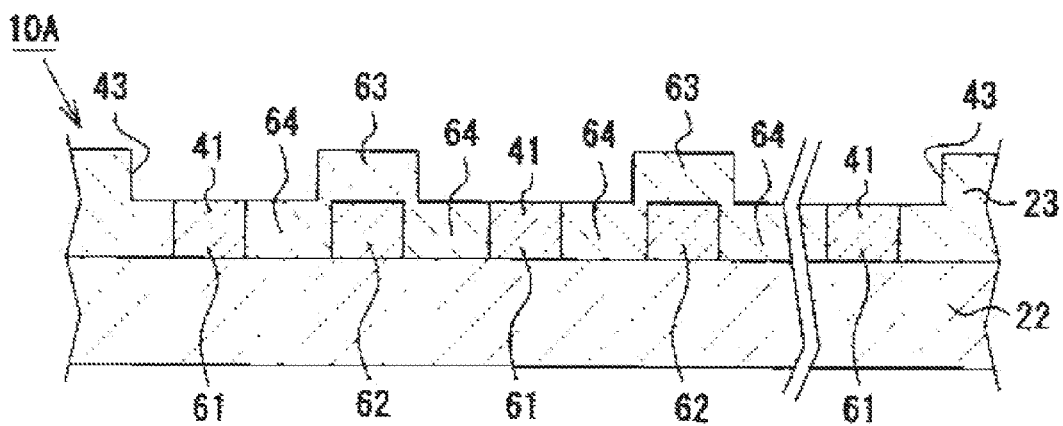
FIG. 13 A main part enlarged sectional view showing a wiring board of another embodiment.

Although, in the above-described embodiment, a height of the reinforcement portion 64 was lower than the height of the connection terminal portion 41 and the surface and the upper portion of the side surface of the connection terminal portion 41 were exposed from the reinforcement portion 64, it is also preferable to adopt a configuration, for example, like an organic wiring board 10A of an other embodiment shown in FIG. 13. That is, this organic wiring board 10A is configured to be in a state where the height of the reinforcement portion 64 is equal to the height of the connection terminal portion 41 and only a surface of the connection terminal portion 41 is exposed from the reinforcement portion 64.

Figure 14:
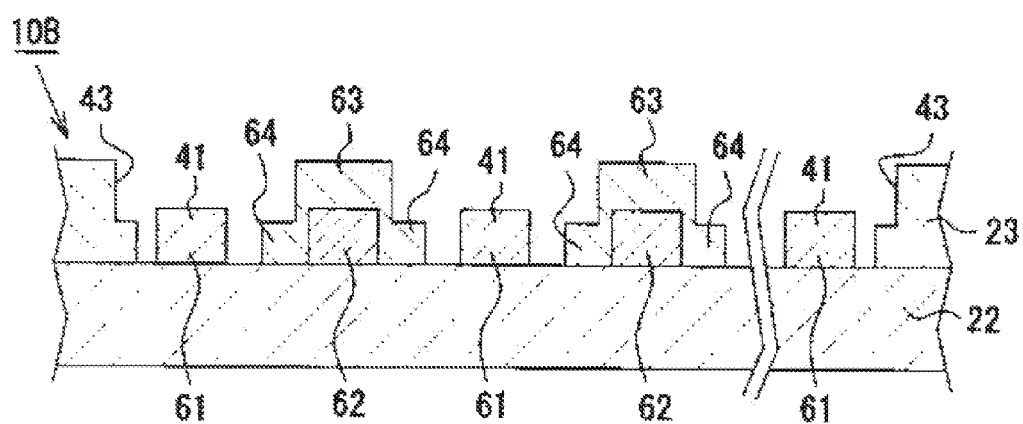
FIG. 14 A main part sectional view showing the wiring board of another embodiment.
Figure 15:
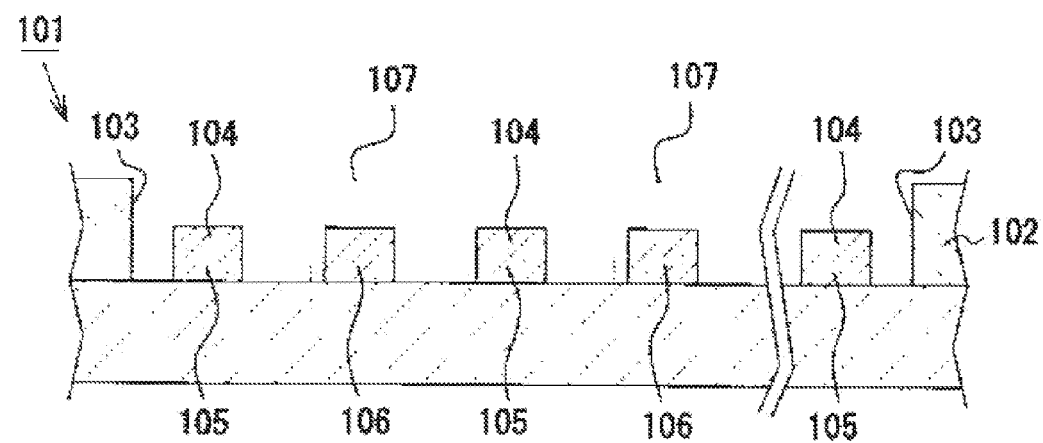
FIG. 15 A main part enlarged sectional view for illustrating a manufacturing method of a conventional organic wiring board.
Figure 16:
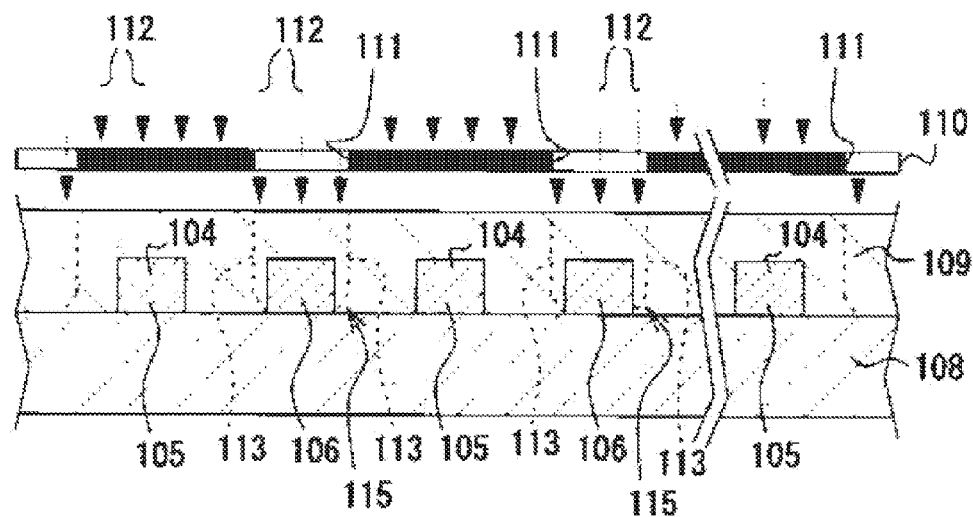
FIG. 16 A main part enlarged sectional view for illustrating the manufacturing method of the conventional organic wiring board.
Figure 17:
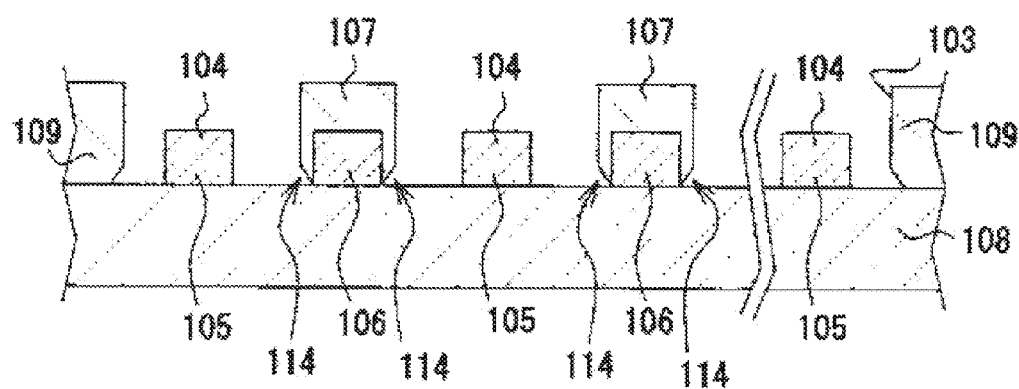
FIG. 17 A main part enlarged sectional view for illustrating the manufacturing method of the conventional organic wiring board.
Figure 18:
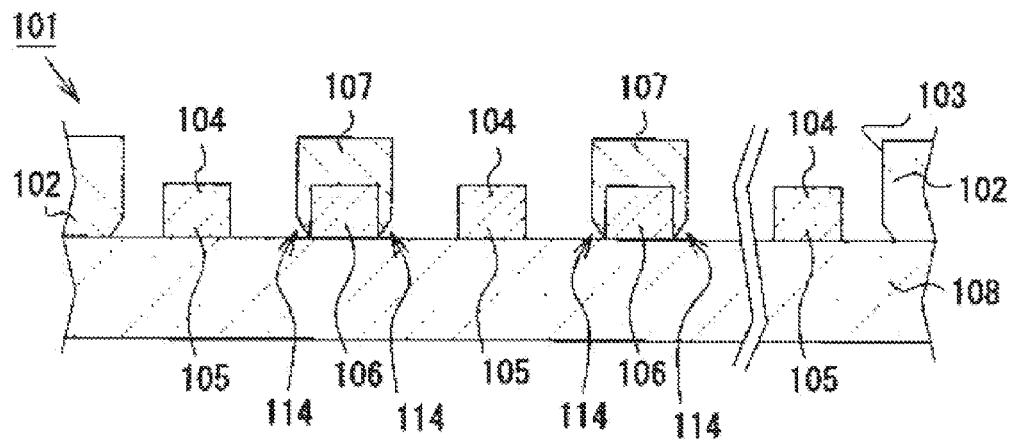
FIG. 18 A main part enlarged sectional view for illustrating the manufacturing method of the conventional organic wiring board.
Figure 19:
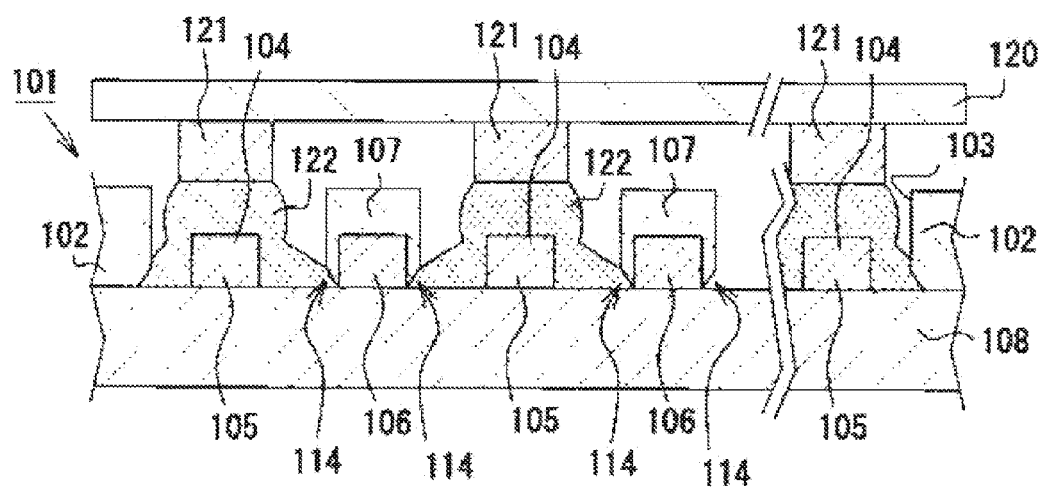
FIG. 19 A main part enlarged sectional view for illustrating the manufacturing method of the conventional organic wiring board.
Figure 20:
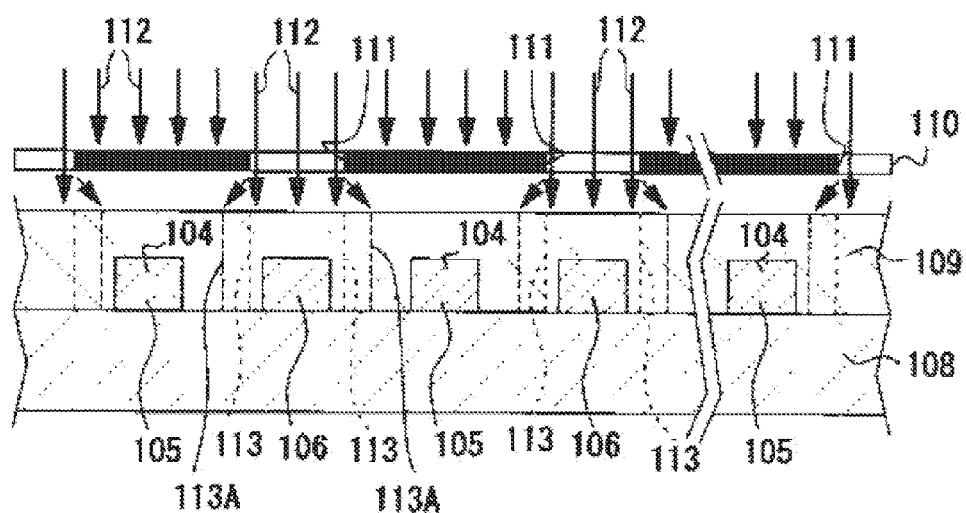
FIG. 20 A main part enlarged sectional view for illustrating the manufacturing method of the conventional organic wiring board.
Figure 21:
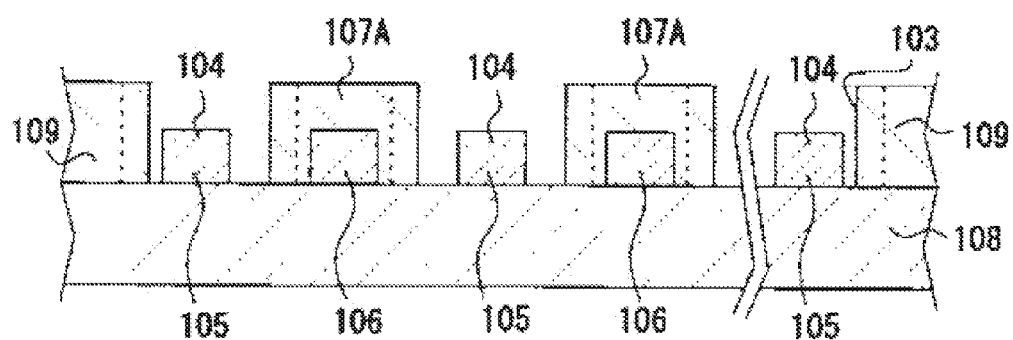
FIG. 21 A main part enlarged sectional view for illustrating the manufacturing method of the conventional organic wiring board.
Figure 22:
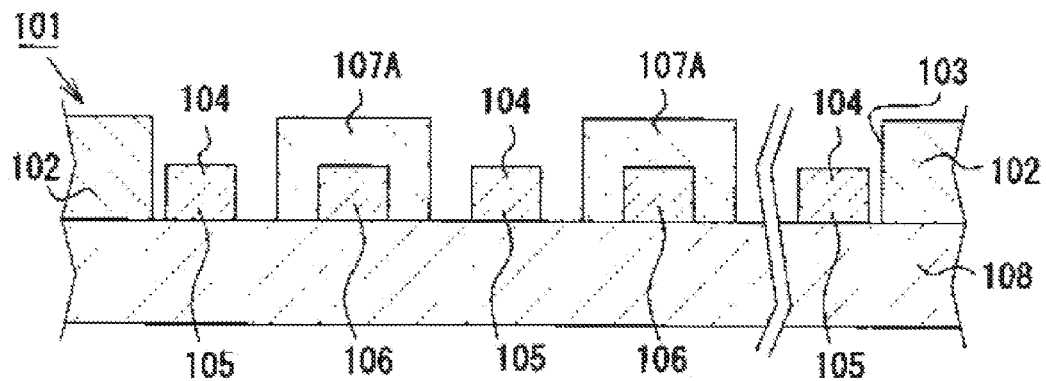
FIG. 22 A main part enlarged sectional view for illustrating the manufacturing method of the conventional organic wiring board.
Figure 23:
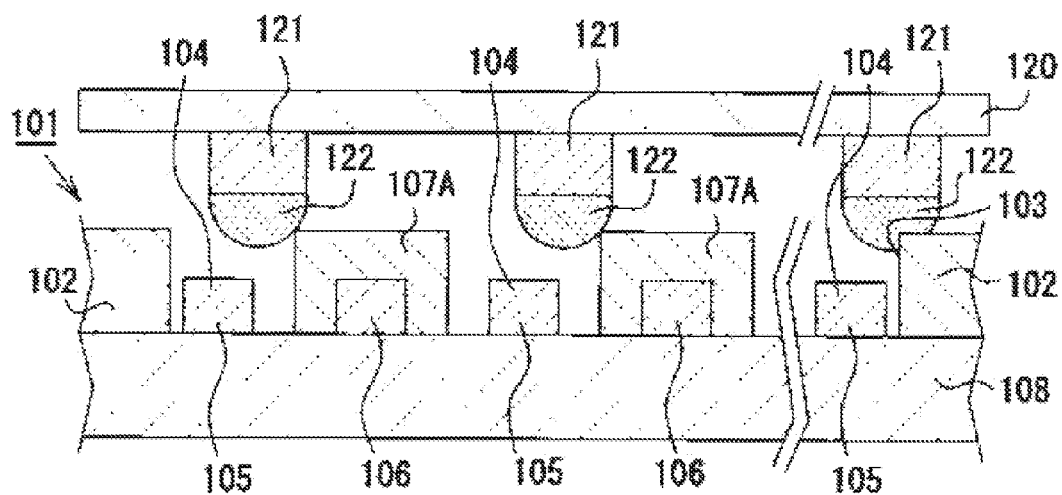
FIG. 23 A main part enlarged sectional view for illustrating the manufacturing method of the conventional organic wiring board.
Figure 24:
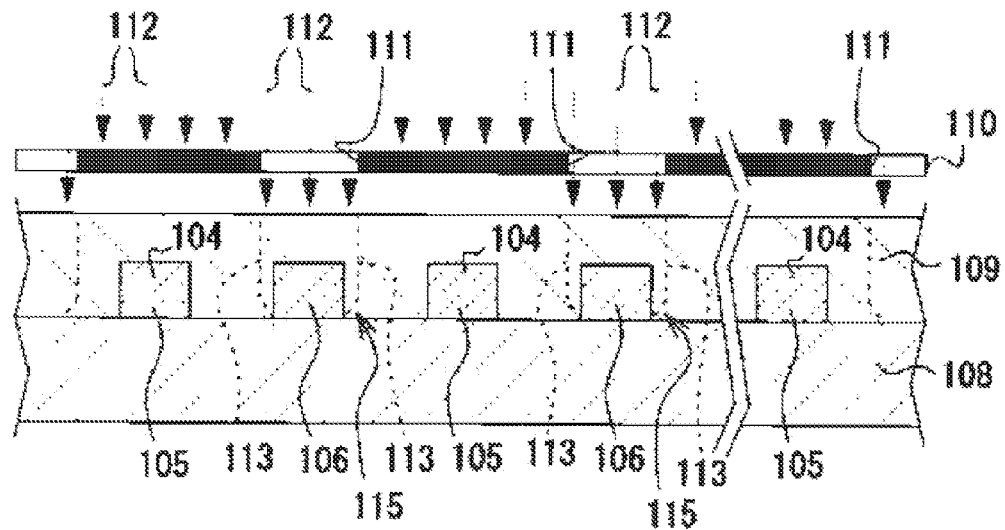
FIG. 24 A main part enlarged sectional view for illustrating the manufacturing method of the conventional organic wiring board.
Figure 25:
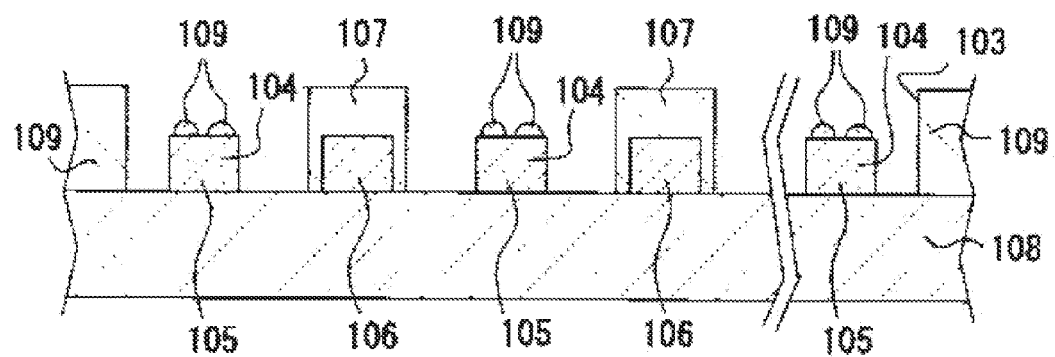
FIG. 25 A main part enlarged sectional view for illustrating the manufacturing method of the conventional organic wiring board.
Figure 26:
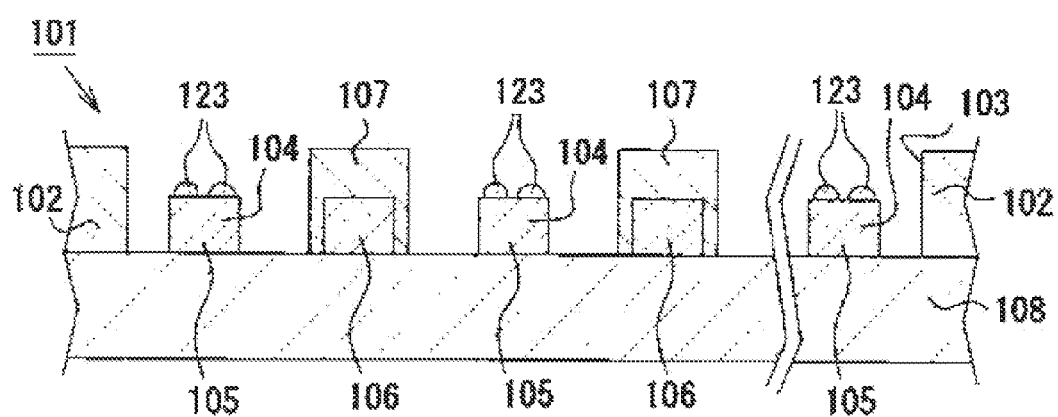
FIG. 26 A main part enlarged sectional view for illustrating the manufacturing method of the conventional organic wiring board.

In the above-described embodiment, although the reinforcement portion 64 was formed so as to completely fill between the unexposed wiring conductors 62 and the connection terminal portions 41 on the surface of the resin insulating layer 22, a configuration where the reinforcement portion 64 do not fill completely like, for example, organic wiring board 10B of an other embodiment shown in FIG. 14 may be adopted. That is, in this organic wiring board 10B, the side surface of the reinforcement portion 64 is not adjacent to the side surface of the connection terminal portion 41.

Although in the above-described embodiment, the dam portion 63 and the reinforcement portion 64 were formed from the common solder-resist material, these portions may be formed using different resin insulating material layers 66, respectively.

In the above-described embodiment, the solder-resist layer 23 was formed, and the dam portion 63 and the reinforcement portion 64 were formed integrally by performing partial exposure and development after providing the resin insulating material having photosensitivity on the surface of the resin insulating layer 22. However, the formation method of the resin insulating layer 23 of the outermost layer can be altered properly. For example, there is a method such that the resin insulating layer 23 of thermosetting property is coated on the surface of the resin insulating layer 22 to be heat cured, and subsequently mechanical polishing is applied until the surfaces of the connection terminal portions 41 are exposed. In this case, abrasive machining, such as a sandblast processing, play be adopted in place of mechanical polishing, and other than this, a dry etching processing may be adopted.

Although the organic wiring board 10 of the above-described embodiment was a wiring board having the core substrate 13, it is not limited to this, and the present invention may be applied to a coreless wiring board that does not have a core.

Although a mode of the organic board 10 in the above-described embodiment is a BGA (ball grid array), it is not limited only to BGA, for example, the present invention may be applied to wiring boards, such as a PGA (pin grid array) and an LGA (land grid array).

DESCRIPTION OF REFERENCE NUMERALS AND SIGNS 10, 10A, 10B - - - Wiring board
21, 22, 23, 26, 27, 28 - - - Resin insulating layer
23 - - - Solder resist layer as resin insulating layer of outermost layer 24 - - - Conductor layer
31 - - - First buildup layer as laminate
32 - - - Second buildup layer as laminate
41 - - - Connection terminal portion
51 - - - Semiconductor chip
54 - - - Mounting area
61 - - - (Exposed) Wiring conductor or
62 - - - (Unexposed) Wiring conductor
63 - - - Dam portion
64 - - - Reinforcement portion
66 - - - Resin insulating material
H1 - - - Height of reinforcement portion
H2 - - - Height of connection terminal portion
H3 - - - Height of dam portion

What is claimed is:

1. A wiring board comprising a laminate, in which one or more resin insulating layers and one or more conductor layers are stacked,
wherein the conductor layer of an outermost layer of the laminate comprises:
a plurality of connection terminal portions, which are disposed in a mounting area of a semiconductor chip and surfaces of which are exposed for flip-chip mounting the semiconductor chip; and
a wiring conductor that is arranged at a predetermined position between the plurality of connection terminal portions, and
wherein the resin insulating layer of the outermost layer of the laminate comprises:
a dam portion for covering the wiring conductor, the dam portion having a corner portion with a first curvature; and
a reinforcement portion, which is formed between the wiring conductor and the connection terminal portion adjacent to the wiring conductor and to be lower than a height of the dam portion, and which is concatenated with a side surface of the dam portion to form a concatenated region between the dam portion and the reinforcement portion, the concatenated region having a second curvature smaller than the first curvature.

2. The wiring board according to claim 1,
wherein the reinforcement portion fills between the wiring conductor and the connection terminal portion adjacent to the wiring conductor.

3. The wiring board according to claim 2,
wherein a height of the reinforcement portion is lower than a height of the plurality of connection terminal portions, and
wherein surfaces and upper portions of side surfaces of the plurality of connection terminal portions are exposed from the reinforcement portion.

4. The wiring board according to claim 1,
wherein the dam portion and the reinforcement portion are formed of a common solder-resist material and are formed in one piece.

5. A manufacturing method of the wiring board according to claim 1, comprising:
a conductor layer formation step of forming the plurality of connection terminal portions and the wiring conductor in a mounting area of the semiconductor chip; and
a resin insulating layer formation step comprising:
forming the resin insulating layer of an outermost layer by arranging a resin insulating material having photosensitivity that becomes the resin insulating layer of the outermost layer on the plurality of connection terminal portions and the wiring conductor in a state where the resin insulating material covers the plurality of connection terminal portions and the wiring conductor and performing partial exposure and development on the resin insulating material; and
integrally forming the dam portion and the reinforcement portion.

* * * * *